(12) United States Patent
Lam

(10) Patent No.: US 8,440,372 B2
(45) Date of Patent: May 14, 2013

(54) SINGLE FIELD ZERO MASK FOR INCREASED ALIGNMENT ACCURACY IN FIELD STITCHING

(75) Inventor: Arthur Lam, Fremont, CA (US)

(73) Assignee: Micrel, Inc., San Jose, CA (US)

( * ) Notice: Subject to any disclaimer, the term of this patent is extended or adjusted under 35 U.S.C. 154(b) by 171 days.

(21) Appl. No.: 13/020,773

(22) Filed: Feb. 3, 2011

(65) Prior Publication Data
US 2012/0202138 A1   Aug. 9, 2012

(51) Int. Cl.
*G03F 1/42*   (2012.01)
(52) U.S. Cl.
USPC .................................................. 430/5; 430/22
(58) Field of Classification Search ................. 430/5, 22
See application file for complete search history.

(56) References Cited

U.S. PATENT DOCUMENTS

2003/0049546 A1 * 3/2003 Kawata ............................. 430/5
2008/0268350 A1 * 10/2008 Yang ................................. 430/5

* cited by examiner

*Primary Examiner* — Christopher Young
(74) *Attorney, Agent, or Firm* — Van Pelt, Yi & James LLP

(57) ABSTRACT

A single field photomask includes a first set of targets formed on a first side of the photomask, and a second set of targets formed on a second side of the photomask, opposite the first side. In operation, the photomask is to be applied to a wafer without any alignment marks. The photomask forms a first set of alignment marks in the wafer from the first set of targets, and the photomask further forms a second set of alignment marks in the wafer from the second set of targets. The first set of alignment marks is used to align to a first field mask and the second set of alignment marks is used to align to a second field mask to stitch an image of the first field mask to an image of the second field mask.

7 Claims, 4 Drawing Sheets

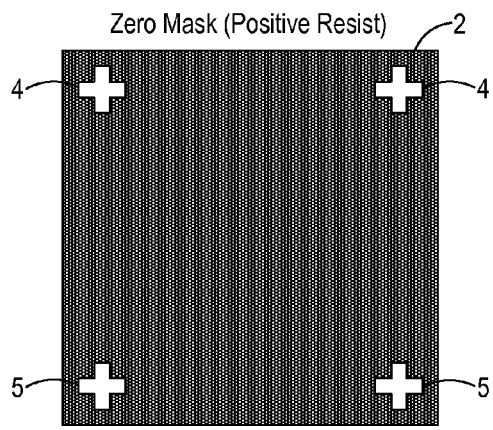
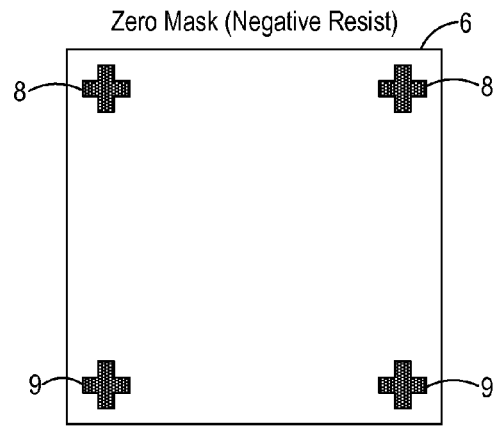
FIG. 1(a)  FIG. 1(b)
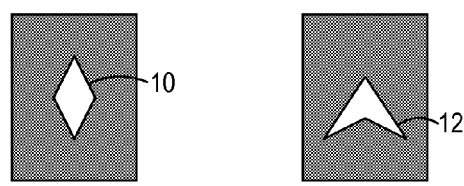
FIG. 2
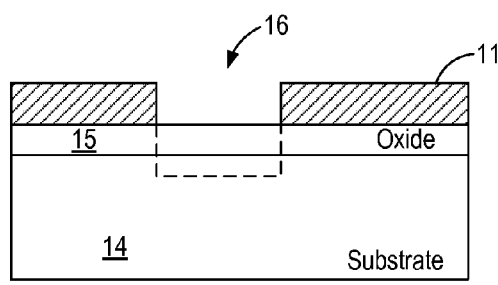
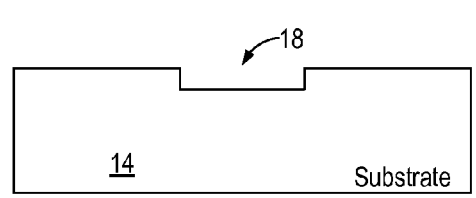
FIG. 3(a)  FIG. 3(b)

SINGLE FIELD ZERO MASK FOR INCREASED ALIGNMENT ACCURACY IN FIELD STITCHING

FIELD OF THE INVENTION

The invention relates to photomask alignment in a lithographic process in semiconductor processing and, in particular, to a single field zero mask for increasing the alignment accuracy in field stitching.

DESCRIPTION OF THE RELATED ART

Photomasks are an integral component in the lithographic process of semiconductor manufacturing. Semiconductor manufacturers use photomasks to optically transfer (or print) images of devices (such as an integrated circuit) onto semiconductor wafers. A lithography tool called stepper projects light through the photomask to print the image of one or more devices onto a field on a semiconductor wafer coated with photoresist. The stepper then moves or steps the wafer and the image is exposed once again onto another field on the wafer. This process is repeated for the entire wafer surface. When using a positive photoresist, the exposed portions of the photoresist are removed so areas of the wafer underneath can either be etched to form channels or be deposited with other materials. Alternately, a negative resist can be used. When using a negative photoresist, the unexposed portions of the photoresist are removed so areas of the wafer under the unexposed portion can either be etched to form channels or be deposited with other materials.

Semiconductor devices manufactured are limited in size by the stepper field size. That is, an integrated circuit usually has a device area or die size no greater than the area of a single stepper field size. However, power devices or power integrated circuits (ICs) can benefit from a die size larger than a stepper field size due to larger power handling capabilities. In other cases, increased functionality incorporated into a power IC may require a large die size.

One way to overcome the limitation of the field size on the die size is to use projection aligners. However due to lens resolution or layer to layer alignment tolerances, the use of projection aligners is not possible in most cases.

Another way to extend the field size is to use stitching techniques in a stepper. However, conventional stitching methods often result in loss of field-to-field registration due to limited accuracy of the stepper motor.

On steppers using field-to-field alignment, the accuracy of the stitching from field to field is limited by the placement of the first masking layer. Since the first layer has no previous alignment marks to align to, it is called a "blind step." Blind step accuracy is limited by the accuracy of the wafer stage motor. The wafer stage motor stepping accuracy translates directly into the stitching accuracy. The various layers of the device will have alignment accuracy that are limited by the stepper motor accuracy. The required alignment accuracy may be greater than the ability of the stepper motor.

SUMMARY OF THE INVENTION

According to one embodiment of the present invention, a single field photomask includes a first set of targets formed on a first side of the photomask, and a second set of targets formed on a second side of the photomask, opposite the first side. In operation, the photomask is to be applied to a wafer without any alignment marks. The photomask forms a first set of alignment marks in the wafer from the first set of targets, and the photomask further forms a second set of alignment marks in the wafer from the second set of targets. The first set of alignment marks is used to align to a first field mask and the second set of alignment marks is used to align to a second field mask to stitch an image of the first field mask to an image of the second field mask.

According to another embodiment of the present invention, a method for stitching a first field mask to a second field mask on a wafer includes providing a photomask with a first set of targets and a second set of targets where the first and second sets of targets are formed on opposite sides of the photomask, printing images of the first set of targets and the second set of targets of the photomask onto the wafer coated with a photoresist layer where the photomask is applied without any alignment marks on the wafer, forming a first set of alignment marks from the first set of targets and forming a second set of alignment marks from the second set of targets, forming a second photoresist layer on the wafer, aligning a first field mask to the first set of alignment marks, exposing the second photoresist layer to the first field mask to print an image of the first field mask onto the second photoresist layer, aligning a second field mask to the second set of alignment marks, and exposing the second photoresist layer to the second field mask to print an image of the second field mask onto the second photoresist layer. As a result, the images of the first field mask and the second field mask are thereby stitched together in the second photoresist layer with an overlap area.

The present invention is better understood upon consideration of the detailed description below and the accompanying drawings.

BRIEF DESCRIPTION OF THE DRAWINGS

FIGS. 1(a) and 1(b) illustrate a representative single field zero mask for positive photoresist and negative photoresist, respectively, according to one embodiment of the present invention.

FIG. 2 illustrates other shapes which can be used for the targets in the single field zero mask according to embodiments of the present invention.

FIGS. 3(a) and 3(b) illustrate the process of forming a field stitching alignment mark in a wafer substrate using the single field zero mask according to one embodiment of the present invention.

DETAILED DESCRIPTION OF THE PREFERRED EMBODIMENTS

Figure 4:
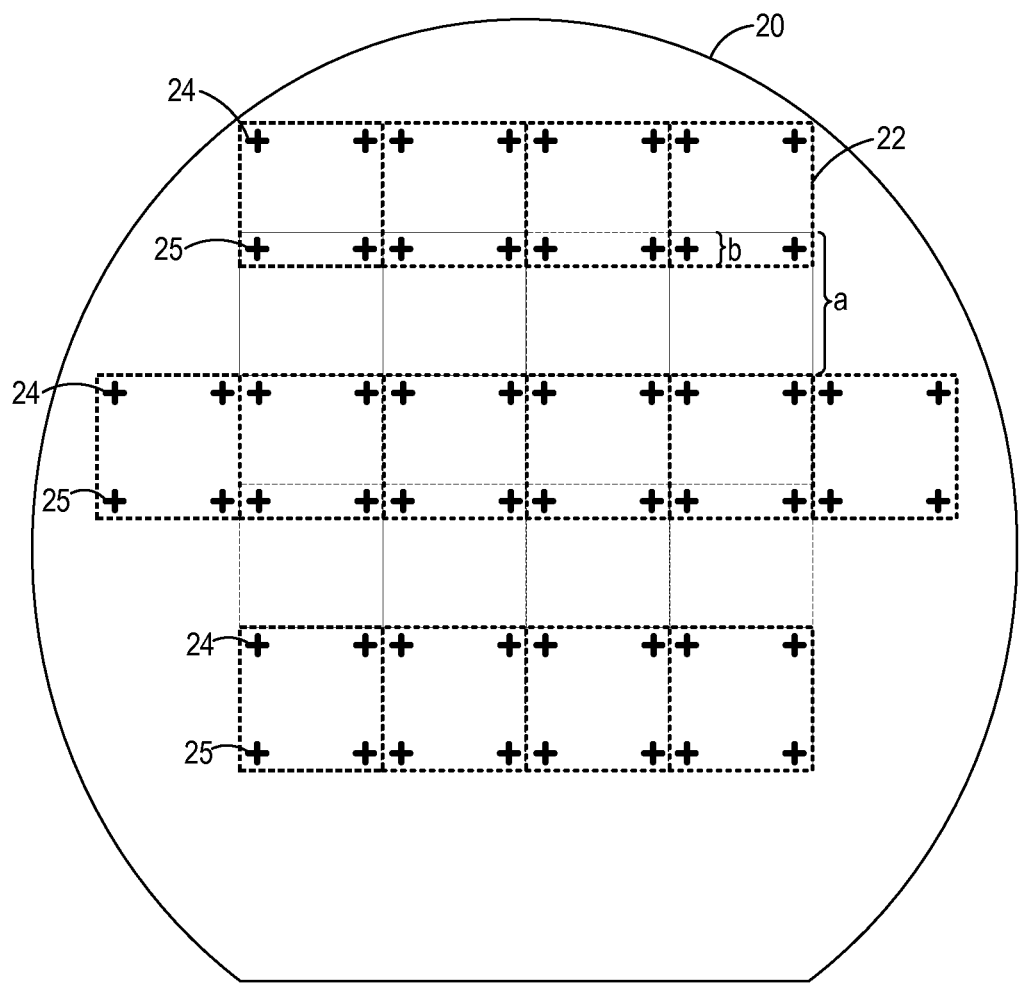
FIG. 4 illustrates the application of the single field zero mask to a wafer to form field stitching alignment marks according to one embodiment of the present invention.

In accordance with the principles of the present invention, a single field zero mask includes two or more sets of targets for forming field stitching alignment marks to enable stitching of two or more fields of subsequent mask layers so as to form an integrated circuit having an area larger than the size of a single stepper field. By forming the alignment marks for multiple fields at the same time using a single mask, no stepper error is introduced in the field stitching alignment marks and high accuracy field stitching can be realized.

In one embodiment, a single field zero mask includes a first set of targets ("top zero targets") to form a first set of field stitching alignment marks ("top alignment marks") for aligning to a top field mask. The single field zero mask further includes a second set of targets ("bottom zero targets") to form field stitching alignment marks ("bottom alignment marks") for aligning to a bottom field mask. The top field mask and the bottom field mask of the subsequent masking layers can then be stitched together using the first and second sets of field stitching alignment marks formed from the first and second sets of targets.

According to embodiments of the present invention, a single field zero mask is used to form targets to which multiple field masks defining an integrated circuit can align. The use of the single field zero mask increases intra-device alignment accuracy. The improved intra-device alignment accuracy is a result of the accuracy of the alignment feedback loop. Since the single field zero mask realizes a closed loop feedback loop for field alignment, the accuracy is significantly better than the accuracy of the wafer stage motor. The single field zero mask enables manufacturing devices that are larger than a stepper field size while ensure low cost of manufacturing.

In the present description, a single field zero mask for aligning a top field mask and a bottom field mask is described. The use of the terms "top" and "bottom" are illustrative only and are not intended to be limiting. The single field zero mask can be used to align a left field or a right field or fields in any directional arrangements. The use of the terms "top" and "bottom" do not have absolute directional significance but rather are used to illustrate relative direction only.

FIGS. 1(a) and 1(b) illustrate a representative single field zero mask for positive photoresist and negative photoresist, respectively, according to one embodiment of the present invention. Referring first to FIG. 1(a), a single field zero mask 2 for positive photoresist includes a first set of targets 4 disposed along a first edge ("the top edge") of the mask and a second set of targets 5 disposed along a second edge ("the bottom edge") of the mask. In the present description, the first set of targets 4 is also referred to as the top zero targets and the second set of targets 5 is also referred to as the bottom zero targets.

Referring now to FIG. 1(b), a single field zero mask 6 for negative photoresist includes a first set of targets 8 disposed along a first edge ("the top edge") of the mask and a second set of targets 9 disposed along a second edge ("the bottom edge") of the mask. In the present description, the first set of targets 8 is also referred to as the top zero targets and the second set of targets 9 is also referred to as the bottom zero targets.

Because zero mask 2 is for positive photoresist, the target areas are exposed areas where the alignment marks are to be formed on the wafer. On the other hand, because zero mask 6 is for negative photoresist, the target areas are covered areas where the alignment marks are to be formed on the wafer.

In the present embodiment, top/bottom zero targets 4 and 5 and top/bottom zero targets 8 and 9 both assume the same shape and are in the shape of a cross. In other embodiments, the top and bottom zero targets may assume different shapes. It is not critical that the top and bottom zero targets have identical shapes. Furthermore, in other embodiments, the zero targets 4, 5, 8 and 9 may have other shapes suitable for facilitating stepper alignment. In some embodiments, the zero targets may assume a diamond shape 10 or a chevron shape 12, as shown in FIG. 2. The zero target shapes shown in FIGS. 1(a), 1(b) and 2 are illustrative only and are not intended to be limiting. The zero target may be configured with other shapes suitable for facilitating stepper alignment.

Examples of other shapes that may be used include square, rectangle, triangle, castle, or any polygon shapes. Many other shapes are possible for implementing the zero target in single field zero mask of the present invention. The exact shape of the zero target is not critical to the practice of the present invention as long as the shape is suitable for facilitating stepper alignment.

FIGS. 3(a) and 3(b) illustrate the process of forming a field stitching alignment mark in a wafer substrate using the single field zero mask according to one embodiment of the present invention. Referring to FIG. 3(a), a wafer substrate 14 on which field-to-field alignment marks are to be formed may have a buffer oxide layer 15 formed thereon. The use of buffer oxide is optional and in other embodiments, other buffering layer or no buffer layer may be used. Regardless of whether zero mask 2 or 6 is used to print an image for the photoresist layer, after the photoresist developing step, a photoresist pattern 11 is formed which exposes a region 16 in the buffer oxide 15 and substrate 14 in which an alignment mark is desired. An etching process, such as wet etch or dry etch process, may then be performed to transfer the target pattern 11 into the substrate 14. After the etching process, the photoresist layer 11 and the buffer oxide layer 15 are removed. As shown in FIG. 3(b), as a result of applying the zero mask to the wafer substrate, an alignment mark 18 is formed in the wafer substrate 14. In one embodiment, the alignment mark 18 is a trench in the wafer substrate and may have a depth of about 1200 Å.

FIG. 4 illustrates the application of the single field zero mask to a wafer to form field stitching alignment marks according to one embodiment of the present invention. Referring to FIG. 4, a single field zero mask 22 is applied to a wafer substrate 20 as the first masking layer. Thus, there is no previous alignment marks for zero mask 22 to align to. The masking step for the zero mask is therefore referred to as a "blind step." The zero mask 22 is applied to wafer 20 coated with a photoresist layer to print the images of the top targets and the bottom targets across the wafer. Typically, in a stepper instrument, the wafer 20 is moved or stepped so that the zero mask 22 is printed onto each field of the wafer. After photoresist developing and etching processes, top alignment marks 24 and bottom alignment marks 25 are formed on wafer 20. The spacing between each row of the zero mask fields should be the length "a" of the bottom field to be stitched, minus the overlap area "b", as will be explained in more detail below.

With the use of the single field zero mask 22, field stitching alignment marks 24, 25 are formed on the wafer 20 for use in field stitching of subsequent masking layers. More specifically, because the top alignment marks 24 and the bottom alignment marks 25 are formed from the same masking field, there is no alignment error between the top and bottom alignment marks. The only error that may be introduced is alignment errors between the fields due to stepper motor error.

Figure 5:
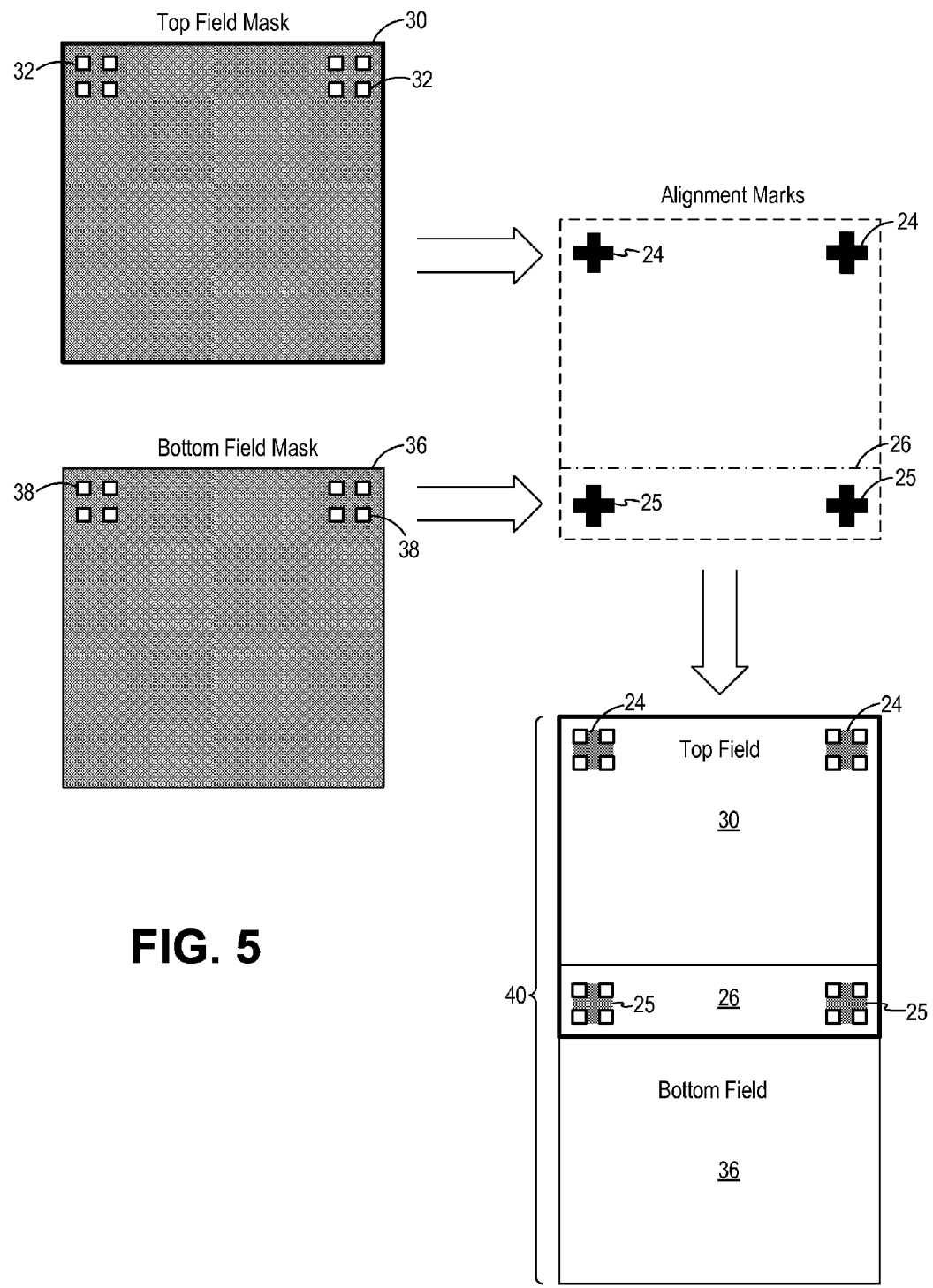
FIG. 5 illustrates the field stitching process using the field stitching alignment marks formed by the single field zero mask according to embodiments of the present invention.

FIG. 5 illustrates the field stitching process using the field stitching alignment marks formed by the single field zero mask according to embodiments of the present invention. Referring to FIG. 5, an integrated circuit is to be formed from the combination of a top field and a bottom field so that the integrated circuit has a device area or die size larger than the field size of the stepper instrument. In a masking step subsequent to the zero mask, a top field mask 30 and a bottom field mask 36 are used so as to print the images for the devices of the integrated circuit. According to embodiments of the present invention, the top field mask and the bottom field mask are stitched together using the top and bottom field stitching alignment marks formed by the top and bottom zero targets of the single field zero mask. In this manner, highly accurate field-to-field stitching is realized.

More specifically, the top field mask 30 includes a set of alignment targets 32 configured to align with the top alignment marks 24 formed on the wafer substrate. The alignment targets 32 are formed on a top side of the top field mask 30. The alignment targets 32 have a shape adapted to align with the shape of the top alignment marks 24. In one embodiment, the alignment target 32 of the top field mask 30 is configured as a complement to the shape of the zero target or the field stitching alignment marks 24 so that the target pattern of target 32 coincide or conform with the alignment mark 24. For instance, when the top alignment marks 24 are formed in a "cross" shape, the alignment target 32 of the top field mask 30 is configured as four squares positioned in the space adjoining the cross, as shown in FIG. 5.

To stitch the bottom field mask to the top field mask, the bottom field mask 36 also includes a set of alignment targets 38 configured to align with the bottom alignment marks 25 formed on the wafer substrate. The alignment targets 38 are formed on a top side of the bottom field mask. The alignment targets 38 have a shape adapted to align with the shape of the bottom alignment marks 25, in the same manner as described above with reference to the top field mask.

As shown in FIG. 5, by aligning the top field mask 30 to the top alignment marks 24 and the bottom field mask 36 to the bottom alignment marks 25, the top and bottom masks 30 and 36 are stitched together with an overlap area 26. As thus processed, an integrated circuit is formed having a device area (or die size) 40 which is greater than the stepper field size.

Figure 6:
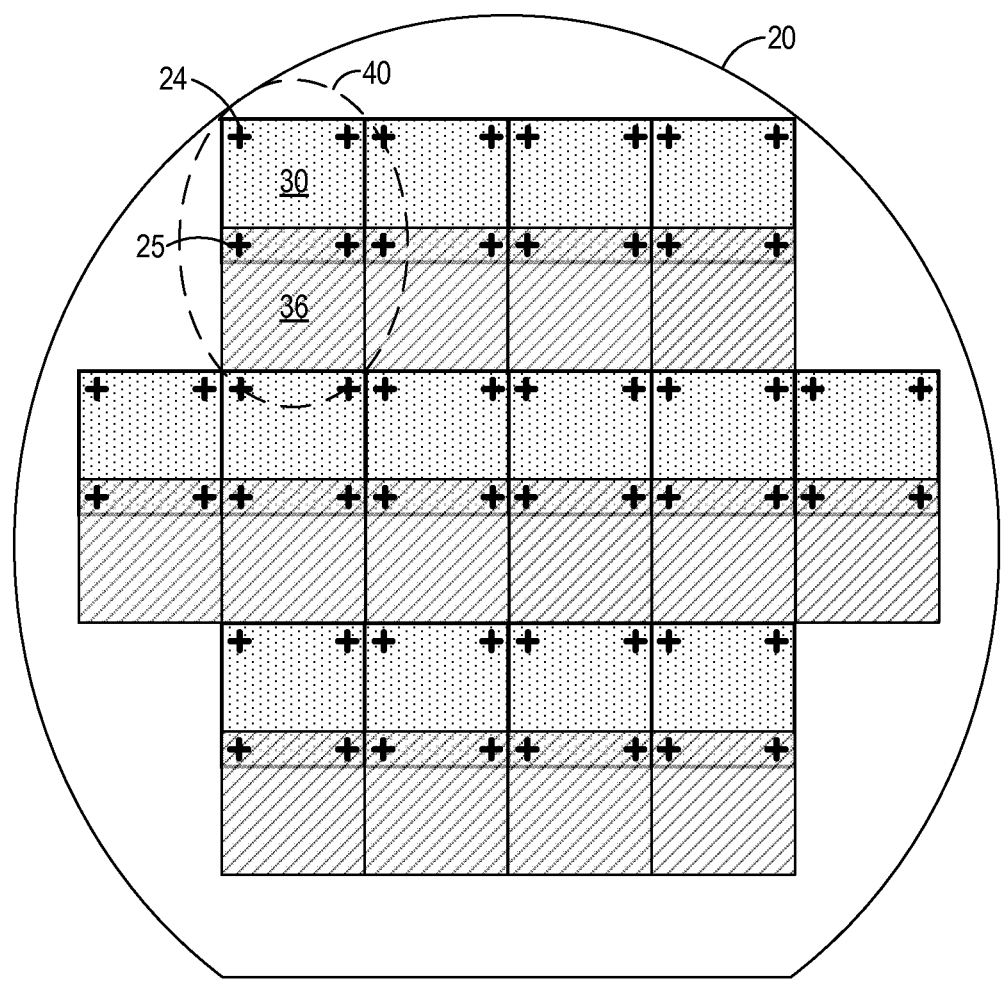
FIG. 6 illustrates the field stitching process using the alignment marks formed by the single field zero mask across a wafer according to embodiments of the present invention.

FIG. 6 illustrates the field stitching process using the alignment marks formed by the single field zero mask across a wafer according to embodiments of the present invention. Referring to FIG. 6, a wafer 20 with field stitching alignment marks 24, 25 formed thereon is coated with a photoresist layer to perform the next masking step. The top field mask 30 is first applied and is aligned to the top alignment marks 24. The top field mask 30 is then exposed to transfer the image of the top field mask to wafer 20. The wafer 20 is then moved or stepped to the next field and the alignment and exposure process repeat until the entire wafer is printed with the top field mask aligned to the top alignment marks 24.

After the top field mask process is completed, the bottom field mask 36 is applied and is aligned to the bottom alignment marks 25. The bottom field mask 36 is then exposed to transfer the image of the bottom field mask to wafer 20. The wafer 20 is then moved or stepped to the next field and the alignment and exposure process repeat until the entire wafer is printed with the bottom field mask aligned to the bottom alignment marks 25. After the top and bottom fields are printed onto the photoresist layer, subsequent fabrication process steps, such as etching or depositing, can be carried out using the pattern defined by the top and bottom fields. The field stitching alignment process is repeated for each layer to form the completed integrated circuit device.

In this manner, the top field and the bottom field of the integrated circuit to be formed are stitched together to form a device area for the integrated circuit that is larger than the stepper field size. Intradie alignment error is limited by the alignment accuracy of the fields to their respective zero targets of the stepper instrument only. The incremental error due to the top and bottom zero target placement is circumvented by this method.

In the above-described embodiments, the single field zero mask includes 2 zero targets in each set of targets. That is, there are two top zero targets and two bottom zero targets. In other embodiments, any number of targets can be used for each set of zero targets. Furthermore, the first set of zero targets and the second set of zero targets do not have to have the same target shape or the same number of targets. Moreover, even within a set of zero targets, the targets do not all have to have the same shape. That is, a set of top zero targets may include targets of different shapes.

Furthermore, in the above-described embodiments, the single field zero mask and the field-to-field stitching process are applied to stitch together a "top" field and a "bottom" field. As described above, the use of "top" and "bottom" here merely describes relative positions and does not describe absolute positioning. In other embodiments, the single field zero mask may be configured to perform side-to-side stitching.

The above detailed descriptions are provided to illustrate specific embodiments of the present invention and are not intended to be limiting. Numerous modifications and variations within the scope of the present invention are possible. The present invention is defined by the appended claims.

I claim:

1. A set of photomasks for stitching an image of a first field to an image of a second field on a substrate, comprising:
a zero mask comprising a first set of targets formed on a first side of the zero mask and a second set of targets formed on a second side, opposite the first side, of the zero mask, the zero mask to be applied to the substrate having no previous alignment marks formed thereon for the zero mask to align to, the zero mask forming a first set of alignment marks in the substrate from the first set of targets and forming a second set of alignment marks in the substrate from the second set of targets;
a first field mask comprising the image of the first field and configured to align to the first set of alignment marks on the substrate formed by the first set of targets of the zero mask; and
a second field mask comprising the image of the second field and configured to align to the second set of alignment marks on the substrate formed by the second set of targets of the zero mask,
wherein the image of the first field is stitched to the image of the second field on the substrate when the first field mask is aligned to the first set of alignment marks and the second field mask is aligned to the second set of alignment marks.

2. The set of photomasks of claim 1, wherein the first set of targets and the second set of targets have the same shape.

3. The set of photomasks of claim 1, wherein the first set of targets and the second set of targets have different shapes.

4. The set of photomasks of claim 1, wherein the first set of targets and the second set of targets have a shape selected from one of a cross, a diamond, or a chevron.

5. The set of photomasks of claim 1, wherein the first set of targets has a first number of targets and the second set of targets has a second number of targets, the first number is the same as the second number.

6. The set of photomasks of claim 1, wherein the first set of targets has a first number of targets and the second set of targets has a second number of targets, the first number is different from the second number.

7. The set of photomasks of claim 1, wherein the first and second field masks have a field size no greater than a stepper field size and the first and second field masks stitched together to form an area greater than the stepper field size.

* * * * *